United States Patent
Schilp et al.

(10) Patent No.: US 9,266,686 B2
(45) Date of Patent: Feb. 23, 2016

(54) VACUUM GRIPPER

(71) Applicant: Zimmermann & Schilp Handhabungstechnik GmbH, Regensburg (DE)

(72) Inventors: Michael Schilp, Regensburg (DE); Josef Zimmermann, Regensburg (DE); Adolf Zitzmann, Teunz (DE)

(73) Assignee: ZIMMERMANN & SCHILP HANDHABUNGSTECHNIK GMBH, Regensburg (DE)

( * ) Notice: Subject to any disclaimer, the term of this patent is extended or adjusted under 35 U.S.C. 154(b) by 0 days.

(21) Appl. No.: 14/259,699

(22) Filed: Apr. 23, 2014

(65) Prior Publication Data

US 2015/0015013 A1 Jan. 15, 2015

Related U.S. Application Data

(63) Continuation of application No. 13/386,593, filed as application No. PCT/DE2010/000860 on Jul. 22, 2010, now abandoned.

(30) Foreign Application Priority Data

Jul. 22, 2009 (DE) .......................... 10 2009 034 474

(51) Int. Cl.
*B25B 11/00* (2006.01)
*B65G 47/91* (2006.01)
*B65G 49/06* (2006.01)
*H01L 21/683* (2006.01)
*B25J 15/06* (2006.01)

(52) U.S. Cl.
CPC ............. *B65G 47/91* (2013.01); *B25J 15/0616* (2013.01); *B65G 47/911* (2013.01); *B65G 49/061* (2013.01); *H01L 21/6838* (2013.01)

(58) Field of Classification Search
USPC ........................................................ 269/21
See application file for complete search history.

(56) References Cited

U.S. PATENT DOCUMENTS

| | | | |
|---|---|---|---|
| 4,618,292 A | 10/1986 | Judge et al. | |
| 4,735,449 A | 4/1988 | Kuma | |
| 5,077,888 A | 1/1992 | Tokisue et al. | |
| 6,515,288 B1 | 2/2003 | Ryding et al. | |
| 6,644,703 B1 | 11/2003 | Levin et al. | |
| 6,781,684 B1 | 8/2004 | Ekhoff | |
| 6,808,358 B1 | 10/2004 | Mayerberg et al. | |
| 6,899,765 B2 | 5/2005 | Krivts et al. | |
| 7,168,747 B2 | 1/2007 | Hoehn et al. | |
| 7,513,716 B2 * | 4/2009 | Hayashi et al. | 406/88 |
| 7,908,885 B2 | 3/2011 | Devitt | |
| 8,113,761 B2 * | 2/2012 | Ahn et al. | 414/676 |
| 8,142,111 B2 | 3/2012 | Kim et al. | |
| 8,690,489 B2 * | 4/2014 | Richman et al. | 406/197 |

FOREIGN PATENT DOCUMENTS

DE  20 2009 002567 U1  7/2009
EP  0 201 240 A1  11/1986

(Continued)

*Primary Examiner* — Lee D Wilson
*Assistant Examiner* — Alvin Grant
(74) *Attorney, Agent, or Firm* — Henry M. Feiereisen LLC

(57) ABSTRACT

A vacuum gripper for gripping a work-piece includes a flat or curved gripper plate having at least one suction port. A work-piece suction throttling zone is formed around the suction port. The gripper plate has at least one recess provided at a side facing the work-piece and arranged beyond the work-piece suction throttling zone (6) formed around the suction port. At least one vent hole is formed within each of the recesses.

13 Claims, 5 Drawing Sheets

(56) References Cited

FOREIGN PATENT DOCUMENTS

| EP | 0 383 336 A2 | 8/1990 |
| EP | 1 387 808 B1 | 11/2005 |
| FR | 1 400 501 | 5/1965 |
| WO | WO 99/33725 A1 | 7/1990 |
| WO | WO 03/060961 A1 | 7/2003 |

\* cited by examiner

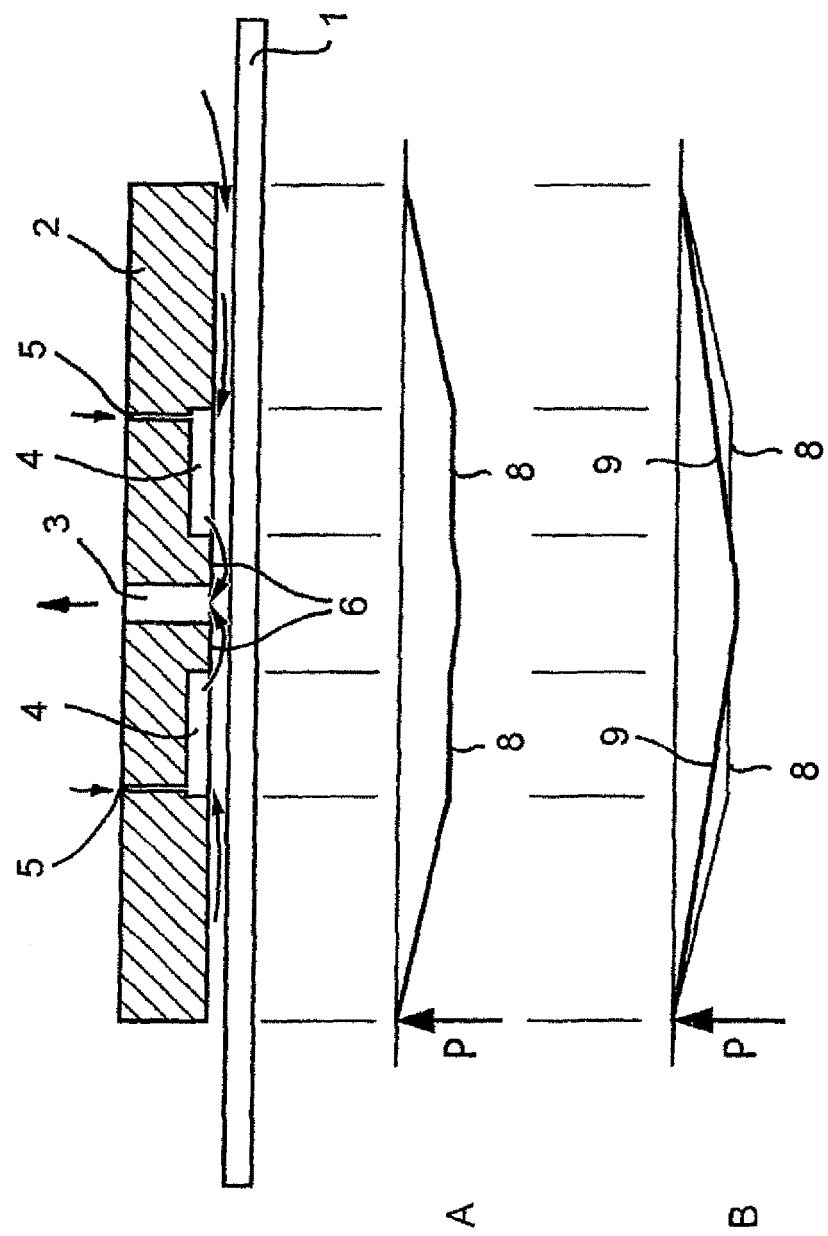

VACUUM GRIPPER

CROSS-REFERENCES TO RELATED APPLICATIONS

This application is a continuation of prior filed U.S. application Ser. No. 13/386,593, filed May 7, 2012, the priority of which is hereby claimed under 35 U.S.C. §120 and which is the National Stage of International Application No. PCT/DE2010/000860, filed Jul. 22, 2010, which designated the United States and has been published as International Publication No. WO 2011/009446 and which claims the priority of German Patent Application, Serial No. 10 2009 039 474.8, filed Jul. 22, 2009, pursuant to 35 U.S.C. 119(a)-(d).

The contents of U.S. application Ser. No. 13/386,593, International Application No. PCT/DE2010/000860, and German Patent Application, Serial No. 10 2009 039 474.8 are incorporated herein by reference in their entirety as if fully set forth herein.

BACKGROUND OF THE INVENTION

The present invention relates to a vacuum gripper and, in particular, to a vacuum gripper for gently gripping work-pieces having sensitive surfaces, such as solar cells, wafers or panels for flat screens, and for gripping heavy glass plates or plates made of a material having a very smooth surface, which are stacked on top of each other and are to be removed from above.

Vacuum grippers are generally known and are constructively adapted to each case of application, that is, to the work-piece to be gripped. If work pieces having sensitive surfaces are to be gripped, special measures must be taken to prevent that surfaces from being damaged.

On principle, there are two kinds of vacuum grippers:
On the one hand, there are vacuum grippers which are put onto the work-piece and, at the beginning of the gripping procedure, are mechanically brought into contact with the surface of work-piece, that is, the gripper is provided with a sealing the lips of which effect a sealing action between the surface of work-piece and the gripper so that, when a vacuum is generated within the gripper, the barometric pressure causes the work-piece to be pressed against the sealing lips. However, due to the high contact pressure, the surface of work-piece can be changed undesirably.

On the other hand, there are vacuum grippers which are constructed such that they suck the work-piece to the gripper head from a certain distance and hold it in a non-contact way close to the gripping surface of the gripper. This effect is gained when the surface of the gripper is formed as an air bearing, for example. An air bearing can be generated by a field of nozzles from which compressed air flows out or by an oscillating plate such as described in the document EP 1387808 B1 which is completely included in the following description.

When the work-piece is sucked, it is urged to the gripper surface by the atmospheric pressure and keeps hanging at it. However, contacting of the gripper surface by the work-piece is prevented by the air bearing. That is, the work-piece is kept levitating under the gripper surface in a predetermined distance without contacting it. However, this functional description is in force only for the stationary state. Therefore, during the procedure of gripping, there is a problem which will be explained below:

In order to lift a work-piece by sucking, an increased suction power is required. However, it would be desirable to reduce the suction power before the work-piece reaches its final position, because otherwise, there is the danger that, caused by its mass force of inertia, the accelerated work-piece overcomes the force generated by the air bearing and hits against the surface of gripper.

In practice, it is often necessary to chose a maximum suction force 10 times greater than the holding force actually required, which, in turn, must slightly be greater than the weight of work-piece, that is, the mass thereof.

Also, there are gripping actions where the maximum suction force must still be greater. This is the case when glass plates have to be lifted separately from a stack or a glass plate has to be lifted from a table having a very smooth surface, for example. In such a case, almost no air is present between the glass plate and the surface of table. When the glass plate is lifted up, first if all, during lifting, the surrounding barometric pressure must be overcome to form a small gap into which air can enter. When the gap is completely filled with air und, thus, the pressure in the gap corresponds to the barometric pressure, the contact pressure initially generated becomes zero so that merely the weight of work-piece has to be overcome. The additional force necessary for separating smooth plates is called breakaway force in the following.

Therefore, a vacuum suction gripper sucking work-pieces without contacting them mechanically, has to be designed so that the suction force of the gripper overcomes the breakaway force and then, accelerates the work-piece towards the surface of gripper, against the gravitational force. It would be desirable to decelerate the work-piece and thus, to reduce its mass force of inertia as soon as it reaches a predetermined distance to the surface of gripper to prevent it from hitting against the gripper.

In an automatic process, as the work-pieces to be lifted have the same size and the same weight, it is theoretically possible to arrange a fast-reacting valve control means behind the suction nozzle, which, after the breakaway force has been overcome, reduces the suction flow in a first action so that the work-piece in the shape of a plate is decelerated to the technologically optimum speed. A second throttling action can be carried out after the plate has already been lifted a predetermined distance, in order to decelerate the plate such that it reaches its final position at the surface of gripper.

An expert knows that the control of such highly dynamic processes is extremely complex and thus costly, because it is difficult to control gaseous media, conditioned by the compressibility thereof.

SUMMARY OF THE INVENTION

Therefore, subject matter of the invention is to provide a reliable and low-cost device enabling also smooth plates requiring a great breakaway force to be lifted in a non-contact way.

This subject matter is solved by a vacuum gripper having the following features: a flat or an arched gripper plate. The gripper plate can be flat to hold plane plates, it can be arched one-dimensionally to hold tubes, for example, or can be arched two-dimensionally to hold ball-shaped work-pieces, for example. Also, the gripper plate can have a shape adapted to the surface of a work-piece to be gripped, provided that the technical science described below is convertible in fluidic respect.

The gripper plate is provided with at least one suction port in which a vacuum can be generated. The suction port is surrounded by a work-piece suction throttling zone. The work-piece suction throttling zone is an area section which, together with the surface of the work-piece, forms a defined gap when the work-piece is sucked. As soon as the work-piece has reached its final position, it is kept hanging at the gripper plate predominantly through this gap. Therefore, the work-piece suction throttling zone is dimensioned so that the suction force generated around this zone is greater than the force caused by the mass-dependant weight of work-piece and acting in the opposite direction.

In addition, the gripper plate is provided with at least one recess, on that side thereof directed to the work-piece. According to the technical science of the invention, this recess is always arranged beyond the work-piece suction throttling zone. In other words, the air sucked in from the edge of the gripper plate flows along the gripper plate up to the suction port, thereby passing the recess assigned to and positioned in front of it. The recess is provided with at least one vent hole.

The function of the vacuum gripper will be described below. As soon as the bottom side of the gripper has reached a position about 2 mm to 0.5 mm away from the top side of work-piece, the vacuum gripper acts like a common vacuum gripper, that is, air is sucked in at the edge of the gripper and flows up to the suction port. Thereby, a negative pressure is generated along the entire gripper surface, the altitude of which lowering in the direction to the edge of gripper. The negative pressure has a constant height within the recess. A predetermined quantity of air is also sucked in through the vent hole. However, this quantity of air is relatively small compared with that sucked in through the 2 mm to 0.5 mm wide gap along the gripper surface.

With this constellation, with a given constant suction pressure and the given area of the gripper plate, the gripper generates its maximum lifting force.

The more the work-piece approaches to the gripper surface, the narrower the gap and, thus, the smaller the cross section through which air can flow from the edge of gripper plate. However, the cross section of the vent hole remains constant. The result is that a negative pressure can not be generated any longer within the recess because air permanently flows through the vent hole into it from the outside. This effect is increased when the cross section through which air is sucked in from the edge of gripper becomes smaller. Therefore, the area of the recess does not contribute any longer to the suction force being the product of effective suction area and suction pressure. In other words: With this constellation, the effective suction area is essentially restricted to the work-piece suction throttling zone and thus, is smaller than that formed with a greater distance between the gripper surface and the surface of work-piece, by a multiple. Thus, the suction force also is smaller by a multiple.

Therefore, the wanted effect is gained, that is, the vacuum gripper generates a very great suction force with a greater distance to the surface of the work-piece to be gripped, which, however, strongly decreases when the surface of work-piece approaches the vacuum gripper, so that, with proper dimensioning of gripper, the work-piece can be prevented from hitting against it.

Thus, the suction force is reduced automatically. When the vacuum gripper is competently dimensioned dependant on the weight of work-piece and the height of suction pressure, the work-piece can be kept levitating without contacting it. In this case, a force balance, that is, a balance between the suctions force lifting the work-piece and the weight of work-piece, which acts downwardly, is gained. When the suction force is changed, that is, is reduced, for example, the work-piece slightly sags. Thereby, the effective suction area is increased, with the result, that the suction force is increased and, thus, the work-piece is drawn upwardly again.

This levitation state is always regulated and is independent on the surface condition of work-piece. Therefore, not only glass plates having smooth surfaces, but also wooden plates having coarse surfaces can be gripped by this gripper.

According to a further advantageous embodiment of the vacuum gripper, the vent holes are executed variably. This enables the suction force to be adjusted to a predetermined distance between the surface of work-piece and the gripper in a simple way.

According to a further advantageous embodiment of the vacuum gripper, each of the recesses is provided with several vent holes which can be closed by choice. This enables the suction force to be adjusted to a predetermined distance between the surface of work-piece and the gripper in a simple way.

According to a further advantageous embodiment of the vacuum gripper, the vent holes are filled with a porous material having the function of a throttle. Thus, the cross section of the vent hole can be dimensioned greater, which enables small-sized grippers to be made more advantageously.

According to a further advantageous embodiment of the vacuum gripper, the porous material is a foamed plastic having open pores and being shaped into a plug. Such plugs can easily be made and exchanged.

According to a further advantageous embodiment of the vacuum gripper, alternatively to the porous material, the vent holes are provided with air filters which function as throttles and can also be exchanged easily.

According to a further advantageous embodiment of the vacuum gripper, the vent holes are executed as tap-holes into which nozzles having different geometries and thus, predetermined flow profiles can be screwed.

According to a further advantageous embodiment of the vacuum gripper, the vent holes comprise controllable flow valves. Thus, when the work-piece is sucked in, the rate of air flow can be controlled effectively and thus, the suction and holding characteristics of the vacuum gripper can be improved.

According to a further advantageous embodiment of the vacuum gripper, the volume of the recess is alterable so that the gripper can be adjusted to an other work-piece more quickly. An alteration of this volume can be effected by inserting any material into the recess. When the gripper is made of steel, for example, magnets can be inserted into the recesses without requiring additional fixing means. It is also possible to screw bolts into the recesses so that the heads thereof contribute to the volume reduction within the recesses.

According to a further advantageous embodiment of the vacuum gripper, the gripper plate is provided with several work-piece suction throttling zones. Such an arrangement is chosen when a plate to be lifted is to be held at several points.

An expert knows that the work-piece suction throttling zones must not have an annular shape unconditionally, but can extend rectilinearly, which will be explained in more detail with the description of the exemplified embodiments.

According to a further advantageous embodiment of the vacuum gripper, the gripper plate is designed as air bearing having air exit nozzles. Thus, an additional measure for preventing any contact between the work-piece and the gripper is provided.

According to a further advantageous embodiment of the vacuum gripper, the gripper plate is mechanically coupled to at least one ultrasonic vibrator and dimensioned so that an ultrasonic air bearing such as described in EP 1387808 B1, for example, is formed.

According to a further advantageous embodiment of the vacuum gripper, the gripper plate is provided with several suction ports, wherein a work-piece suction throttling zone is formed around each of the suction ports. Such an arrangement can be used advantageously for lifting a work-piece having an even surface, for example, which the gripper applies to, but being different in thickness. The suction ports can be admitted with different suction pressures, which enable a work-piece to be lifted uniformly and in horizontal position.

BRIEF DESCRIPTION OF THE DRAWING

In the following, the invention will be described by means of exemplified embodiments in connection with the drawings enclosed.

DETAILED DESCRIPTION OF PREFERRED EMBODIMENTS

Figure 1B:
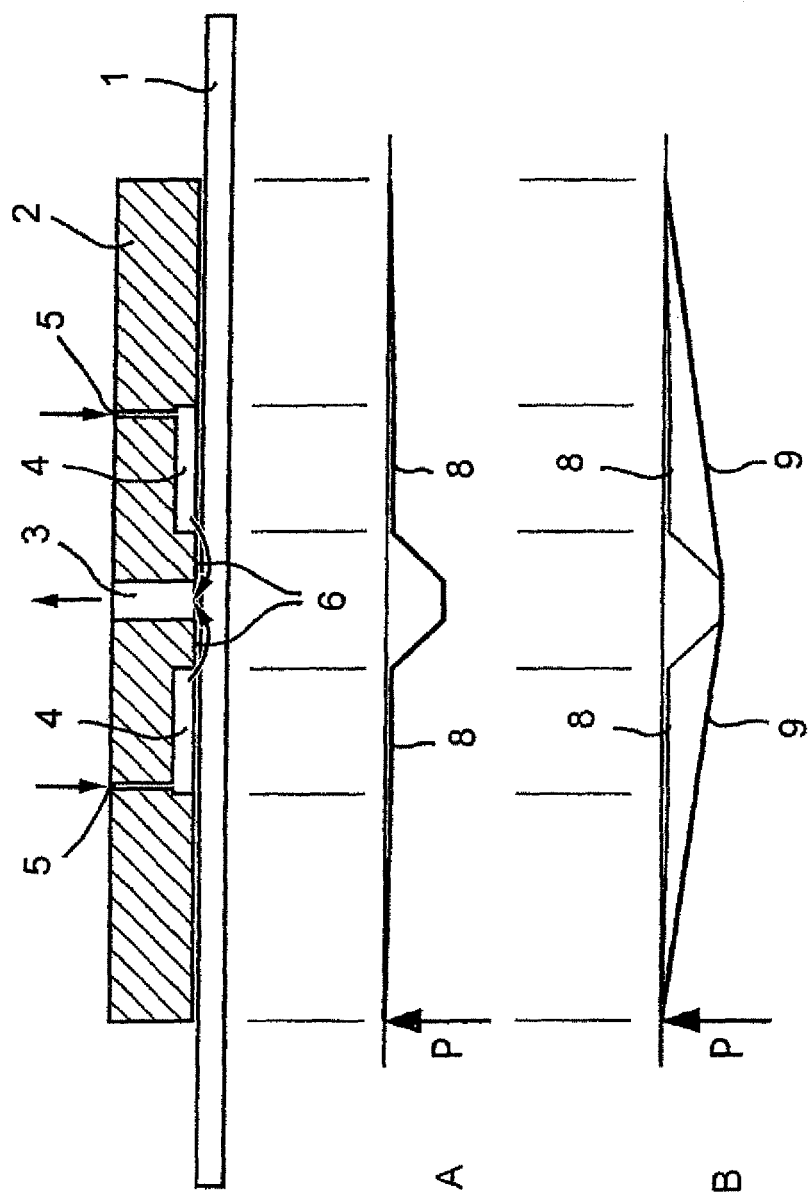
FIGS. 1a, b show a first embodiment of the vacuum gripper.

FIGS. 1a, b show a cross-sectional view of a circular vacuum gripper for carrying a work-piece 1, wherein the vacuum gripper comprises the following features: a disk-shaped round gripper plate 2 provided with a suction port 3 in its center. A round annular work-piece throttling zone 6 is formed around the suction port 3, the operating characteristics of which being explained in the consecutive section. The gripper plate 2 is also provided with an annular recess 4 extending towards the margin of plate, which has two vent holes 5 dislocated to each other by 180 degrees, that is, the entire recess 4 is connected with the atmosphere.

FIG. 1a shows the work-piece 1 still in its initial position. By the suction action of the gripper, air is sucked from the outside of gripper through the gap 7 usually having a width of about 2 mm to 0.8 mm and flows through the suction port 3. In this position, the vacuum gripper generates its maximum suction force being greater than the weight of the work-piece 1.

Thereby, the work-piece 1 lifted. In other words: When the bottom side of the gripper approaches the surface of work-piece, the vacuum gripper acts like a common vacuum gripper, that is, air is sucked via the edge of gripper plate and flows towards the suction port. Thus, a negative pressure is generated along the entire gripper surface, the height of which decreasing towards the edge of gripper. However, in the region of the recess 4, the negative pressure P is constant, represented by the plateau line 8 in the diagram A below this figure. Also, a predetermined volume of air is sucked through the vent hole. However, this volume of air is relatively small compared with that sucked through the 2 mm to 0.5 mm wide gap.

In the diagram B, in addition to the pressure distribution indicated in diagram A, a pressure distribution 9 is indicated, which would arise without the recesses 4.

As shown in FIG. 1b, the more the work-piece approaches the gripper surface, the smaller the gap 7 through which air flows from the outside, that is, from the edge of gripper plate. Thus, the cross section of the gap, through which air can flow from the edge of gripper plate, is reduced remarkably. However, the cross sections of the vent holes remain constant. Because air in an adequate amount can permanently flow from the outside through the vent holes, a negative pressure is not generated any longer in the recess 4. This effect is intensified with the reduction of the cross section of the gap 7 through which air flows from the outside. Therefore, the area of the recess does not contribute any longer to the suction force being the product of effective suction area and suction pressure. In other words: With this constellation, the effective suction area is essentially restricted to the work-piece suction throttling zone 6 and thus, is smaller than that formed with a greater distance between the gripper surface and the surface of work-piece, by a multiple. Thus, the suction force also is smaller by a multiple.

Therefore, the wanted effect is gained, that is, the vacuum gripper generates a very great suction force with a greater distance to the surface of the work-piece to be gripped, which, however, is decreased remarkably when the surface of work-piece approaches the vacuum gripper so that hitting of the work-piece against the gripper is prevented, provided that the gripper is dimensioned properly.

The diagrams A and B drawn below FIG. 1b represent the pressure distribution with and without a recess 4, respectively.

Thus, the suction force is reduced automatically. When the vacuum gripper is competently dimensioned based on the weight of work-piece and the height of suction pressure, the work-piece can be held in a levitation state without contacting the vacuum: gripper. In this case, a force balance is gained between the suction force lifting the work-piece and the weight drawing the work-piece downwardly. When the suction force is somewhat lowered, for example, the work-piece 1 slightly sags. However, as the effective suction area is increased at this moment, the suction force is also increased so that the work-piece 1 is drawn upwardly again.

Nozzle geometry and negative pressure required are determined by the properties of the work-piece to be gripped. With numerous technological processes, work-pieces of the same kind are used so that nozzle and pressure parameters can be kept constant. As the nozzle and pressure parameters are dependant on the size, the weight, the surface and some further features of work-piece, it is not meaningful to specify shapes of nozzles and other parameters.

Further embodiments of the vacuum gripper are shown in the corresponding figures mentioned above, all of which working according to the technical science described in connection with FIG. 1. Therefore, in the following, the new features of each of these embodiments will be described only, but not the general technical science again.

Figure 2A:
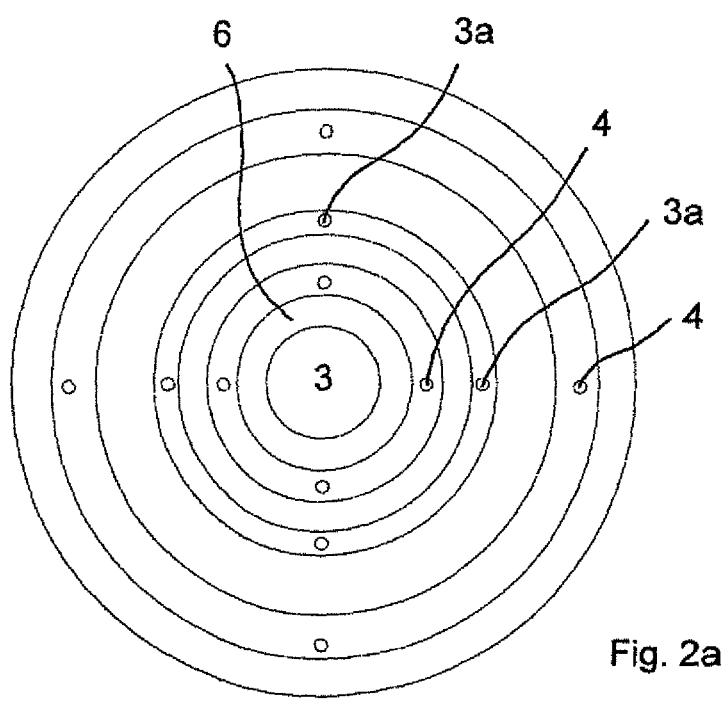
FIGS. 2a, b show a second embodiment of the vacuum gripper.
Figure 2B:
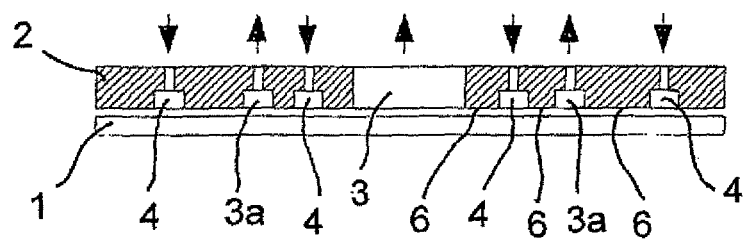

FIGS. 2a, b show a circular gripper plate having a suction port 3 and four suction ports 3a, in which a vacuum is generated, wherein the suction ports 3a are connected with each other by an annular groove. With this embodiment, as the sum of the cross sections of the suction ports 3a is remarkably smaller than the cross section of the suction port 3, the suction effect thereof is also smaller than that of the suction port 3. If necessary, the cross sections of the suction ports 3a can be increased such that the suction effect thereof is almost the same as that of the suction port 3.

Figure 3A:
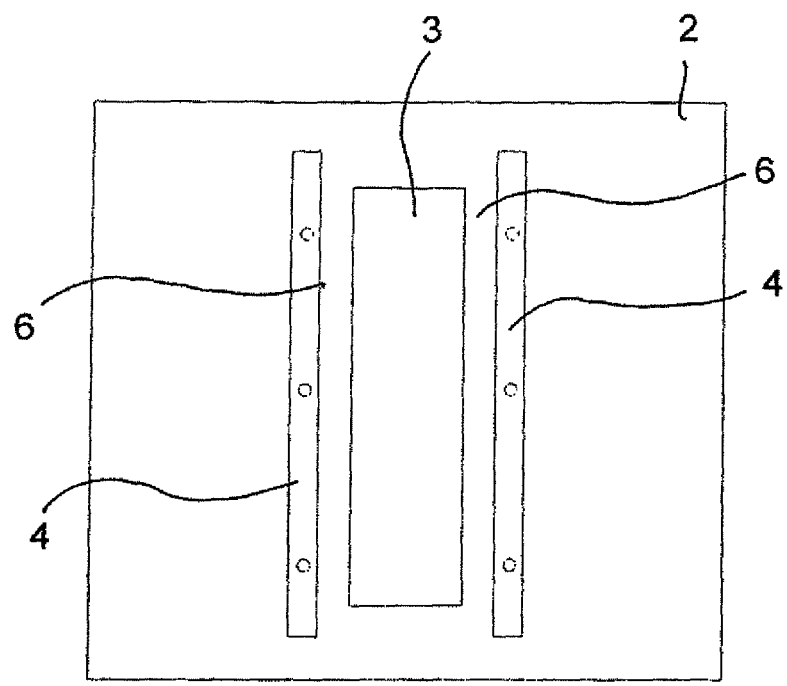
FIGS. 3a, b show a third embodiment of the vacuum gripper.

FIGS. 3a, b show a rectangular gripper plate for optimum gripping of work-pieces preferably being rectangular in shape. With this embodiment, the suction port 3 has a rectangular cross section and the groove-like recesses 4 are arranged in parallel with each other.

Figure 3B:
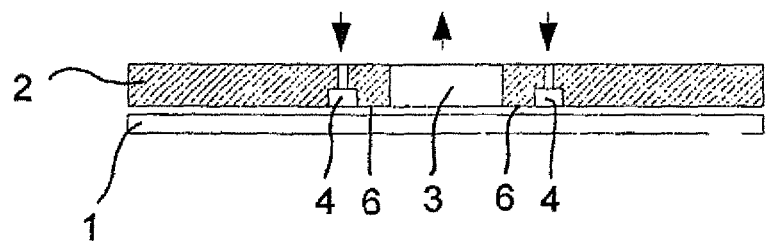
Figure 4A:
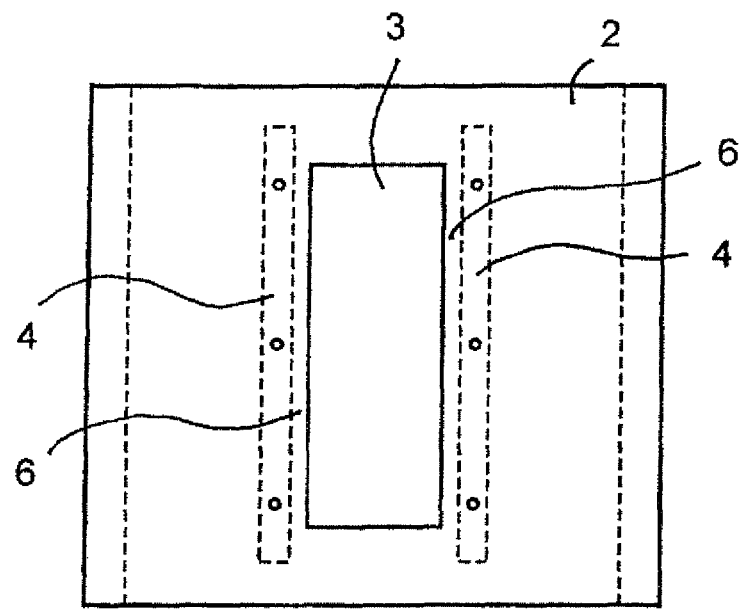
FIGS. 4a, b show a fourth embodiment of the vacuum gripper
Figure 4B:
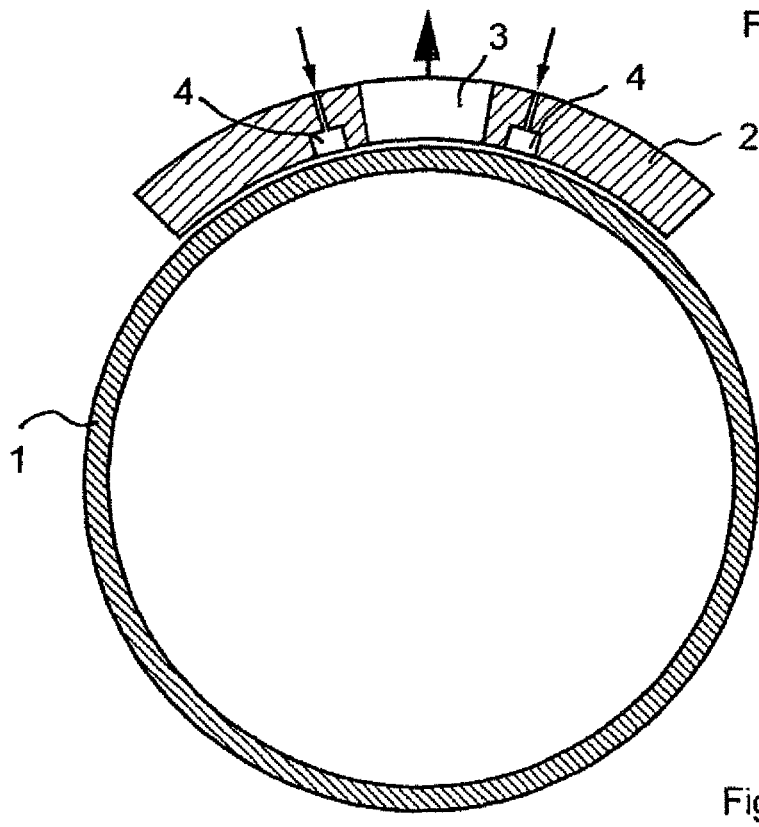

FIGS. 4a, b show a gripper plate like that represented in FIG. 3, but designed for gripping a tube. For this purpose, the shape of gripper plate is proportioned to the radius of tube.

What is claimed is:

1. A vacuum gripper for gripping a work-piece, comprising:
   a flat or curved gripper plate,
   at least one suction port provided in the gripper plate, wherein a work-piece suction throttling zone is formed around the suction port, said work-piece suction throttling zone constituting a sub-area of the gripper plate, wherein a gap is defined between the work-piece suction throttling zone and a surface of the work-piece in a final position of the work-piece relative to the vacuum gripper in which the work-piece is held by the vacuum-gripper, and wherein the work-piece is predominantly held via the air gap in the final position;
   at least one recess provided in the gripper plate at a side facing the work-piece and arranged beyond the work-piece suction throttling zone formed around the suction port, and
   at least one vent hole formed within each of the recesses and said at least one vent hole directly connecting an entirety of the recess to the outer atmosphere so as to constantly permit a flow of air of the outer atmosphere into the recess.

2. The vacuum gripper of claim 1, wherein the cross sections of the vent holes are variable.

3. The vacuum gripper to of claim 1, further comprising plural said at least one recess, wherein several vent holes are formed within each of the plural recesses, said vent holes being selectively closable.

4. The vacuum gripper of claim 1, wherein the vent holes are filled with a porous material.

5. The vacuum gripper of claim 4, wherein the porous material is a foamed plastic having open pores and shaped in the form of a plug.

6. The vacuum gripper of claim 1, wherein the at least one vent hole comprises an exchangeable air-filter.

7. The vacuum gripper of claim 1, wherein the at least one vent hole is constructed as a tap-hole for screwing in nozzles having different geometries.

8. The vacuum gripper of claim 1, wherein the at least one vent hole comprises a controllable flow valve.

9. The vacuum gripper of claim 1, wherein a volume of the at least one recesses recess is variable.

10. The vacuum gripper of claim 1, wherein several work-piece suction throttling zones are provided within the gripper plate.

11. The vacuum gripper of claim 1, wherein the gripper plate is formed as air bearing having air exit nozzles.

12. The vacuum gripper of claim 1, wherein the gripper plate is mechanically coupled to at least one ultrasonic vibrator, wherein the gripper plate is dimensioned so that it forms an ultrasonic air bearing.

13. The vacuum gripper of claim 1, wherein several suction ports are provided, wherein work-piece suction throttling zone is respectively formed around each of the several suction ports.

* * * * *